United States Patent
Beppu et al.

(10) Patent No.: US 11,699,731 B2
(45) Date of Patent: Jul. 11, 2023

(54) SEMICONDUCTOR DEVICE AND MANUFACTURING METHOD THEREOF

(71) Applicant: KIOXIA CORPORATION, Tokyo (JP)

(72) Inventors: Takayuki Beppu, Yokkaichi Mie (JP); Masayuki Kitamura, Yokkaichi Mie (JP); Hiroshi Toyoda, Yokkaichi Mie (JP); Katsuaki Natori, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 39 days.

(21) Appl. No.: 17/003,181

(22) Filed: Aug. 26, 2020

(65) Prior Publication Data

US 2021/0066468 A1    Mar. 4, 2021

(30) Foreign Application Priority Data

Aug. 26, 2019  (JP) .................... 2019-153948

(51) Int. Cl.
*H01L 29/423* (2006.01)
*H01L 21/28* (2006.01)
*H01L 29/49* (2006.01)
*H10B 43/27* (2023.01)

(52) U.S. Cl.
CPC .. *H01L 29/42372* (2013.01); *H01L 21/28079* (2013.01); *H01L 29/495* (2013.01); *H10B 43/27* (2023.02)

(58) Field of Classification Search
CPC ......... H01L 29/42372; H01L 21/28079; H01L 27/11582; H01L 29/495; H01L 29/40117; H01L 27/1157; H01L 27/11524; H01L 27/11556
See application file for complete search history.

(56) References Cited

U.S. PATENT DOCUMENTS

| | | | |
|---|---|---|---|
| 8,922,018 B2 | 12/2014 | Ishizaki et al. | |
| 10,068,845 B2 | 9/2018 | Chebiam et al. | |
| 10,131,986 B2 | 11/2018 | Suzuki et al. | |
| 2015/0364488 A1* | 12/2015 | Pachamuthu | H01L 21/02532 257/314 |
| 2017/0263634 A1 | 9/2017 | Inokuma et al. | |
| 2018/0294187 A1 | 10/2018 | Thombare et al. | |
| 2019/0067094 A1* | 2/2019 | Zope | C23C 16/045 |

FOREIGN PATENT DOCUMENTS

| TW | 201807812 A | 3/2018 |
|---|---|---|
| TW | 201903847 A | 1/2019 |

* cited by examiner

*Primary Examiner* — Mohammed R Alam
(74) *Attorney, Agent, or Firm* — Foley & Lardner LLP

(57) ABSTRACT

According to at least one embodiment, a semiconductor device includes a plurality of insulating films adjacent to each other. A conductive film is provided between the plurality of insulating films. The conductive film includes molybdenum having a grain diameter substantially the same as a distance from an upper surface to a lower surface of the conductive film.

14 Claims, 16 Drawing Sheets

SEMICONDUCTOR DEVICE AND MANUFACTURING METHOD THEREOF

CROSS-REFERENCE TO RELATED APPLICATION(S)

This application is based upon and claims the benefit of priority from Japanese Patent Application No. 2019-153948, filed Aug. 26, 2019, the entire contents of which are incorporated herein by reference.

FIELD

At least one embodiment described herein relates generally to a semiconductor device and a manufacturing method thereof.

BACKGROUND

Semiconductor memory have been developed that include a three-dimensional memory cell array having three-dimensionally arranged memory cells. The three-dimensional memory cell array is formed as a stacked body in which insulating films and conductive films are alternately stacked, and includes a columnar semiconductor layer provided in a stacking direction of the stacked body. The memory cells are provided between the conductive films of the stacked body and the columnar semiconductor layer.

In a process of manufacturing the conductive films, a seam may be generated in the conductive films when the conductive films are embedded between the insulating films adjacent to each other. Such a seam causes a permeation of an etching solution in a subsequent wet etching process, and causes over-etching.

Examples of related art include U.S. patent Ser. No. 10/068,845.

DETAILED DESCRIPTION

Figure 1:
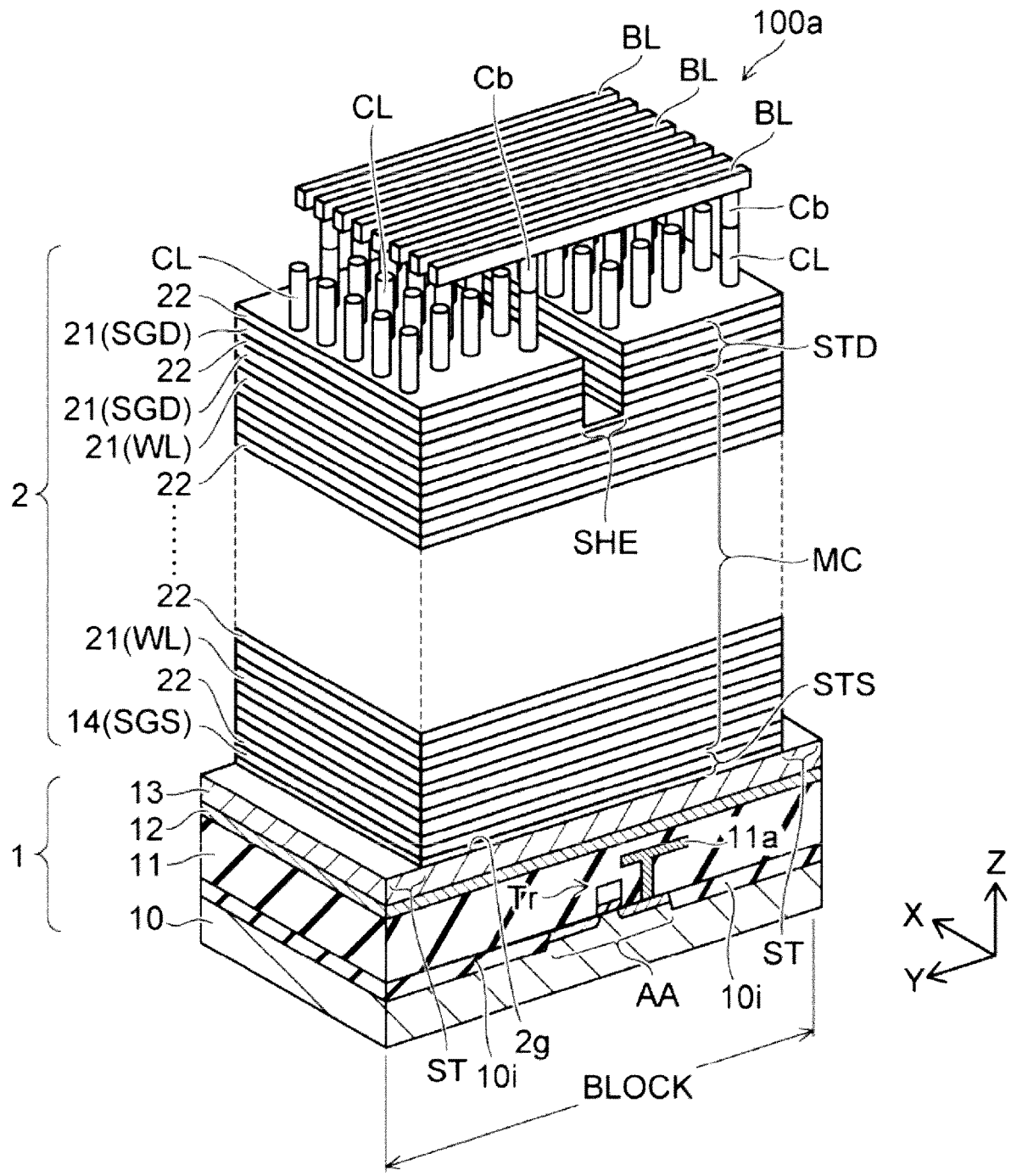
FIG. 1 is a perspective view showing a configuration example of a semiconductor device according to a first embodiment.

At least one embodiment provides a semiconductor device in which over-etching is prevented in a conductive film provided between a plurality of insulating films adjacent to each other, and a manufacturing method thereof.

In general, according to at least one embodiment, a semiconductor device includes a plurality of insulating films adjacent to each other. A conductive film is provided between the plurality of insulating films. The conductive film includes molybdenum having a grain diameter substantially the same as a distance from an upper surface to a lower surface of the conductive film.

Hereinafter, embodiments of the present disclosure will be described with reference to the drawings. The embodiments do not limit the present disclosure. In the following embodiments, a vertical direction of a semiconductor substrate indicates a relative direction when a surface on which a semiconductor element is provided is directed upward, and may be different from a vertical direction according to a gravitational acceleration. The drawings are schematic or conceptual, and a ratio of each portion or the like is not necessarily the same as an actual one. In the description and the drawings, the same reference numerals are given to elements similar to those described above with reference to the previous drawings, and a detailed description is omitted as appropriate.

First Embodiment

FIG. 1 is a perspective view showing a configuration example of a semiconductor device 100a according to a first embodiment. Here, a stacking direction of a stacked body 2 is defined as a Z direction. A direction orthogonal to the Z direction is defined as a Y axis direction. A direction orthogonal to each of the Z and Y axis directions is defined as an X direction.

In the embodiment, the semiconductor device 100a is a nonvolatile memory including a three-dimensional memory cell array having three-dimensionally arranged memory cells. For example, the nonvolatile memory is an NAND flush memory.

The semiconductor device 100a includes a base unit 1, the stacked body 2, and a plurality of columnar portions CLs.

The base unit 1 includes a substrate 10, an insulating film 11, a conductive film 12, and a semiconductor unit 13. The insulating film 11 is provided on the substrate 10. The conductive film 12 is provided on the insulating film 11. The semiconductor unit 13 is provided on the conductive film 12. The substrate 10 is the semiconductor substrate, for example, a silicon substrate. In a surface region of the substrate 10, for example, element isolation areas 10i are provided. The element isolation area 10i is, for example, an insulating region including a silicon oxide, and defines an active area AA in the surface region of the substrate 10. Source and drain regions of a transistor Tr are provided in the active area AA. The transistor Tr constitutes a peripheral circuit of the nonvolatile memory. The insulating film 11 includes the silicon oxide for example, and insulates the transistor Tr. In the insulating film 11, a wiring 11a is provided. The wiring 11a is a wiring electrically connected to the transistor Tr. For the conductive film 12, for example, a conductive metal such as tungsten is used. For the semiconductor unit 13, for example, a semiconductor material such as silicon is used.

The stacked body 2 is provided above the substrate 10 and is located in the Z direction with respect to the semiconductor unit 13. The stacked body 2 is formed by alternately stacking a plurality of conductive films 21 and a plurality of insulating films 22 in the Z direction. Therefore, the Z direction is the stacking direction of the stacked body 2. For the conductive films 21, for example, molybdenum is used. For the insulating films 22, for example, the silicon oxide is used. The insulating films 22 electrically insulate the plurality of conductive films 21 adjacent in the Z direction. The number of layers for the conductive films 21 and for the insulating films 22 is optional. The insulating films 22 may be, for example, spaces (gaps). An insulating film 2g is provided between the stacked body 2 and the semiconductor unit 13, for example. For the insulating film 2g, for example, the silicon oxide is used. A high dielectric having a relative dielectric constant higher than the silicon oxide may be used for the insulating film 2g.

The conductive films 21 constitute at least one source-side selection gate SGS, a plurality of word lines WLs, and at least one drain-side selection gate SGD. The source-side selection gate SGS is a gate electrode of a source-side select transistor STS. The word lines WLs are gate electrodes of memory cells MCs. The drain-side selection gate SGD is a gate electrode of a drain-side select transistor STD. The source-side selection gate SGS is provided in a lower region of the stacked body 2. The drain-side selection gate SGD is provided in an upper region of the stacked body 2. The word lines WLs are provided between the source-side selection gate SGS and the drain-side selection gate SGD.

The semiconductor device 100a includes a plurality of memory cells MCs connected in series between the source-side select transistor STS and the drain-side select transistor STD. A structure in which the source-side select transistor STS, the plurality of memory cells MCs, and the drain-side select transistor STD are connected in series is called a "memory string" or an "NAND string". The memory string is connected to bit lines BLs via contacts Cbs, for example. The bit lines BLs are provided above the stacked body 2 and extend in the Y direction.

Figure 2:
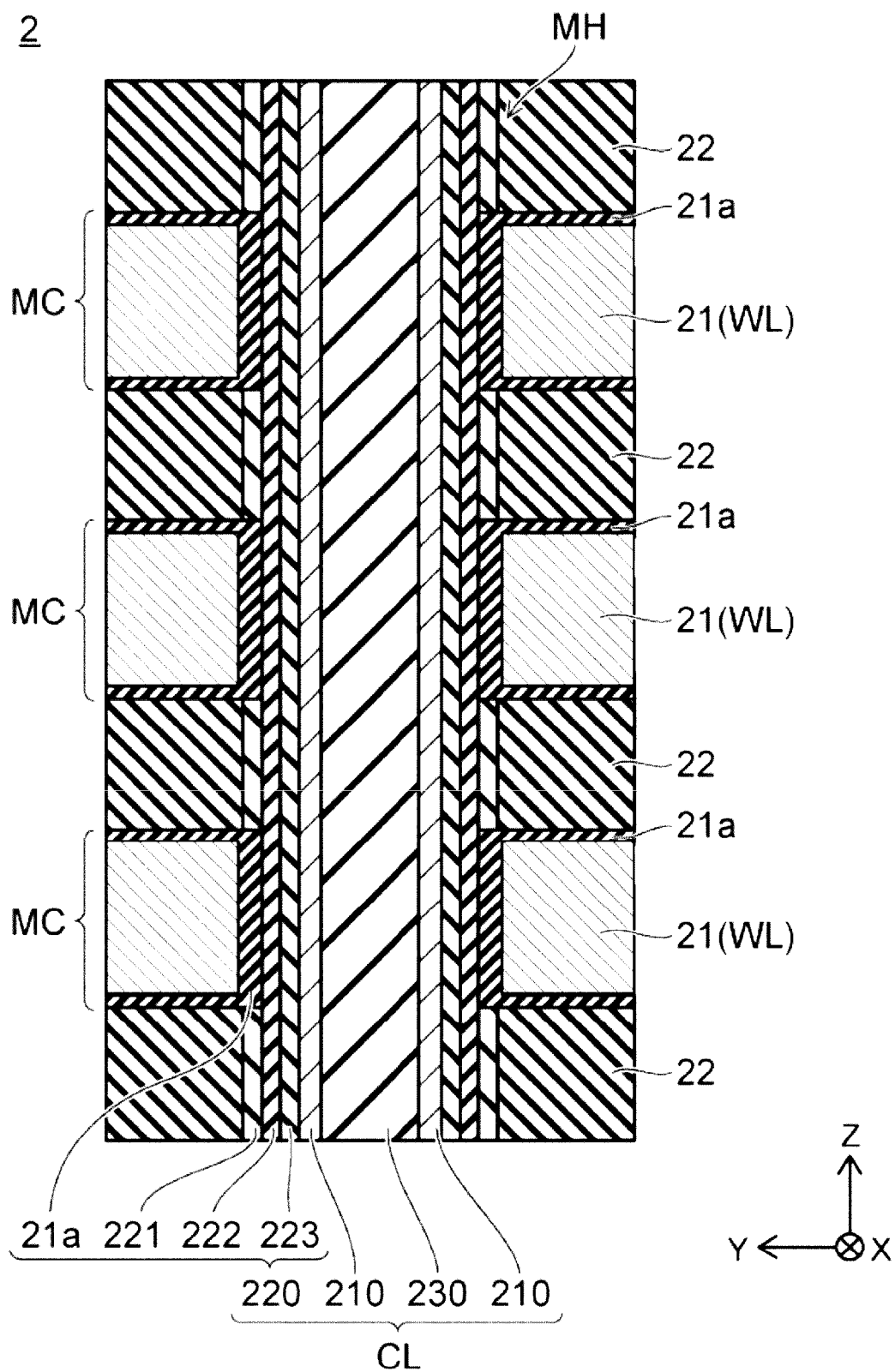
FIG. 2 is a cross-sectional view showing a configuration example of a memory cell array having a three-dimensional structure.
Figure 3:
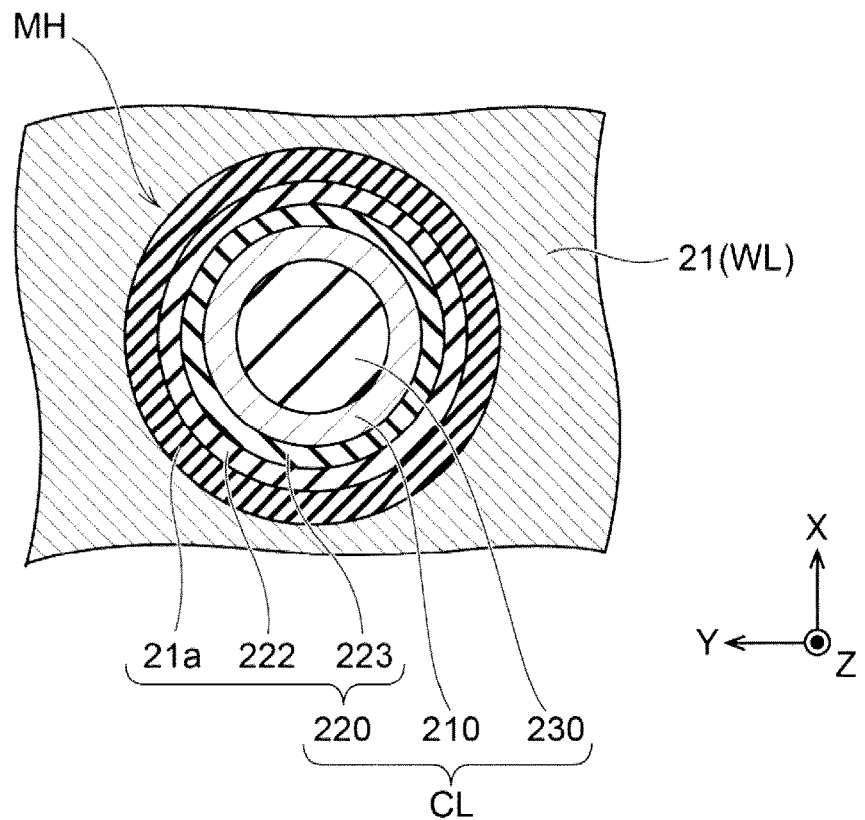
FIG. 3 is a cross-sectional view showing the configuration example of the memory cell array having the three-dimensional structure.

FIGS. 2 and 3 are cross-sectional views showing a configuration example of a memory cell array having a three-dimensional structure. The plurality of columnar portions CLs are provided in memory holes MHs provided in the stacked body 2, respectively. The memory holes MHs are provided in the Z direction so as to penetrate through the inside of the stacked body 2 from an upper end of the stacked body 2. Inside the memory hole MH, a semiconductor body 210, a memory film 220 and a core layer 230 are provided. The semiconductor body 210, the memory film 220, and the core layer 230 extend in the Z direction along the memory hole MH. The semiconductor body 210 as a semiconductor pillar is electrically connected to the semiconductor unit 13. The plurality of columnar portions CLs arranged in the Y direction is commonly connected to one bit line BL via the contacts Cbs.

As shown in FIG. 3, a shape of the memory hole MH on an X-Y plane is, for example, a circle or an ellipse. A block insulating film 21a constituting a part of the memory film 220 is provided between the conductive film 21 and the insulating film 22. The block insulating film 21a is, for example, an insulating metal oxide film such as an aluminum oxide. The block insulating film 21a is provided between the conductive film 21 and the semiconductor body 210 near the conductive film 21, and between the conductive film 21 and the insulating film 22. The block insulating film 21a prevents back tunneling of charges from the conductive film 21 toward a memory film 220 side. In addition, the block insulating film 21a also functions as a seed layer of the conductive film 21 (the molybdenum).

A shape of the semiconductor body 210 is, for example, a cylindrical shape. For the semiconductor body 210, for example, a semiconductor material such as polysilicon is used. The semiconductor body 210 is a channel region for each of the drain-side select transistor STD, the memory cells MCs, and the source-side select transistor STS.

The memory film 220 includes the block insulating film 21a, a cover insulating film 221, a charge trapping film 222, and a tunnel insulating film 223. The memory film 220 is provided in the cylindrical shape so as to extend in the Z direction along an inner wall of the memory hole MH. In addition, the memory film 220 is interposed between the semiconductor body 210 and the conductive film 21 or the insulating film 22. The plurality of memory cells MCs include the memory film 220, as a storage region, between the semiconductor body 210 and the conductive film 21 as the word line WL, and are arranged in the Z direction. Each of the semiconductor body 210, the charge trapping film 222, and the tunnel insulating film 223 is formed along the inner wall of the memory holes MH, and extends in the Z direction.

The cover insulating film 221 is provided between the insulating film 22 and the charge trapping film 222. For the cover insulating film 221, for example, the silicon oxide is used. The cover insulating film 221 protects the charge trapping film 222 from being etched when a sacrificial film (23 in FIG. 13) is replaced with the conductive film 21 (in a replacement process).

The charge trapping film 222 is provided between the block insulating film 21a and the tunnel insulating film 223, or between the cover insulating film 221 and the tunnel insulating film 223. For the charge trapping film 222, for example, a silicon nitride is used. The charge trapping film 222 includes trap sites trapping the charges. A portion of the charge trapping film 222 sandwiched between the conductive film 21 (the word line WL) and the semiconductor body 210 constitutes the storage region of the memory cell MC as a charge trapping unit. A threshold voltage of the memory cell MC changes depending on an amount of the charges trapped in the charge trapping unit. Accordingly, the memory cell MC can store data.

The tunnel insulating film 223 is provided between the semiconductor body 210 and the charge trapping film 222. For the tunnel insulating film 223, for example, an insulating material such as the silicon oxide, the silicon nitride, or a silicon oxynitride film is used. When injecting electrons from the semiconductor body 210 into the charge trapping unit (a writing operation) and when injecting holes from the semiconductor body 210 into the charge trapping unit (an erasing operation), the electrons and the holes pass through (tunnel) a potential barrier of the tunnel insulating films 223.

Thus, the tunnel insulating film 223 is provided between the conductive film 21 and the semiconductor body 210. Then, the charge trapping film 222 is interposed between the tunnel insulating film 223 and the conductive film 21, and the block insulating film 21a is interposed between the charge trapping film 222 and the conductive film 21. Accordingly, the charge trapping film 222 captures or discharges the charges from the semiconductor body 210 via the tunnel insulating film 223. On the other hand, the block insulating film 21a does not pass the charges accumulated in the charge trapping film 222 to the conductive film 21 and does not pass the charges from the conductive film 21 to the charge trapping film 222. Therefore, the memory cells MCs can store the data or erase the data in or from the charge trapping film 222.

The core layer 230 embeds an internal space of the semiconductor body 210 having the cylindrical shape. The core layer 230 has, for example, a columnar shape and is formed by, for example, the insulating material such as the silicon oxide.

The semiconductor device 100a further includes a semiconductor unit 14. The semiconductor unit 14 is located between the stacked body 2 and the semiconductor unit 13. The semiconductor unit 14 is provided between the insulating film 2g and the insulating film 22 which is closest to the semiconductor unit 13. The semiconductor unit 14 functions as, for example, the source-side selection gate SGS.

Figure 4:
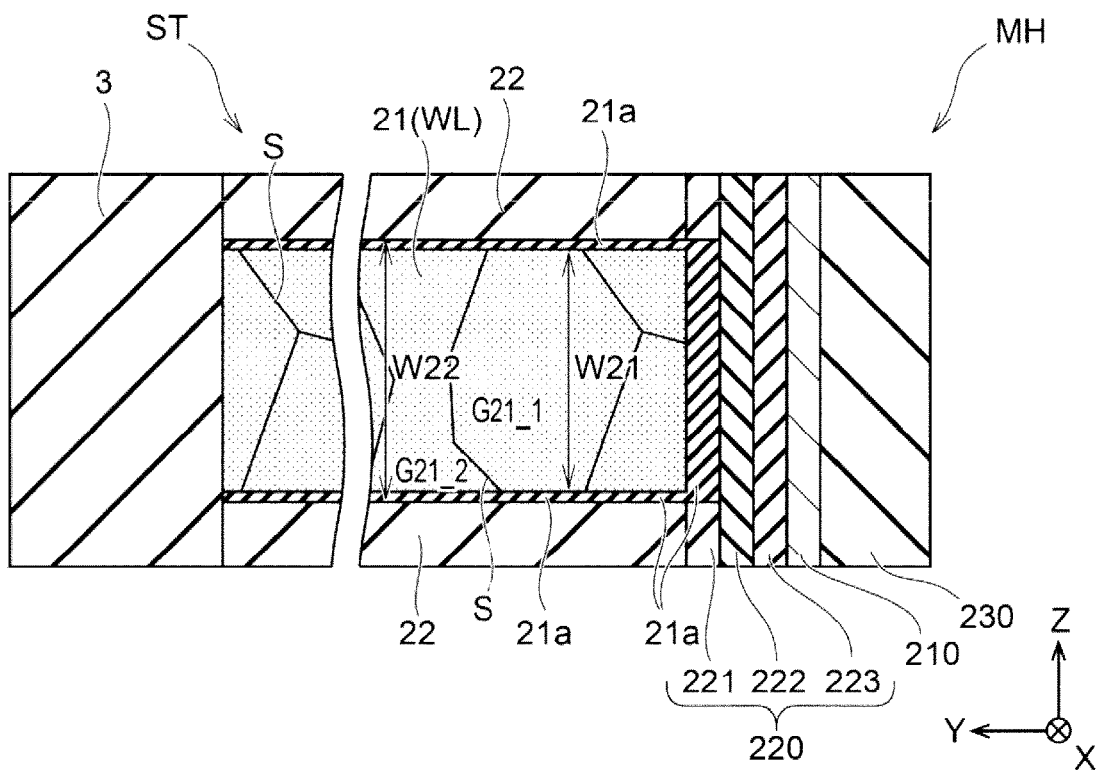
FIG. 4 is a cross-sectional view showing a more detailed configuration example of a conductive film and a periphery thereof.

FIG. 4 is a cross-sectional view showing a more detailed configuration example of the conductive film 21 and a periphery thereof. As described with reference to FIG. 2, the memory film 220 and the semiconductor body 210 are provided in the memory hole MH.

The conductive film 21 functioning as the word line WL is provided between the plurality of insulating films 22 adjacent to each other in the Z direction. The conductive film 21 faces a slit ST in the Y direction. The slit ST is used to replace the sacrificial film (see 23 in FIG. 13) with a material of the conductive film 21 (the molybdenum) when forming the conductive film 21 as described later. After embedding the material of the conductive film 21 in the slit ST and between the insulating films 22, the material of the conductive film 21 in the slit ST is removed, but at this time, the material of the conductive film 21 embedded between the insulating films 22 remains as shown in FIG. 4. Since the material of the conductive film 21 in the slit ST is removed, the conductive films 21 remaining between the insulating films 22 are electrically separated from each other, and can function as the word lines WLs, respectively. FIG. 4 shows one conductive film 21 of the plurality of conductive films 21 (the plurality of word lines WLs). Thereafter, the slit ST is filled with an insulating material 3 such as a silicon oxide film.

As described above, the molybdenum is used for the conductive film 21. The conductive film 21 is formed by using the molybdenum having a particle diameter substantially the same as a distance (a thickness) W21 from an upper surface to a lower surface of the conductive film 21. Alternatively, the conductive film 21 is formed by using the molybdenum having a particle diameter substantially the same as a distance (an interval) W22 between the plurality of insulating films 22 adjacent to each other. For example, crystal grains G21_1 and G21_2 of the conductive film 21 shown in FIG. 4 are large crystal grains that reach from the upper surface to the lower surface of the conductive film 21. In addition, the block insulating film 21a is provided between the conductive film 21 and the insulating film 22, but a thickness of the block insulating film 21a is much thinner than the thickness of the conductive film 21 (the distance W21). Therefore, particle diameters of the crystal grains G21_1 and G21_2 may be substantially the same as the interval (a width) W22 between the plurality of insulating films 22 adjacent to each other.

As described above, by setting the particle diameters of the crystal grains of the conductive film 21 in a size extending from the upper surface to the lower surface, seams S in the conductive film 21 extending in the Y direction from the slit ST toward the memory hole MH are shortened or reduced. For example, in FIG. 4, the crystal grains G21_1 and G21_2 are provided from the upper surface to the lower surface. Therefore, the seams S extending in the Y direction from the insulating material 3 of the slit ST do not pass from the crystal grains G21_1 and G21_2 to a memory hole MH side, and are cut off by the crystal grains G21_1 and G21_2. Accordingly, in a process of forming the conductive film 21, when the material of the conductive film 21 in the slit ST is wet-etched, an etching solution hardly enters the conductive film 21. As a result, over-etching of the conductive film 21 remained as the word line WL can be prevented, and an increase in resistance of the conductive film 21 and an unintended electrical disconnection can be prevented. That is, the resistance of the word line WL can be reduced.

On the other hand, in the conductive film 21, the seams extending in the Y direction (a direction substantially perpendicular to the stacking direction) from the slit ST to the memory hole MH are reduced, but the seams S extending in the Z direction (the tacking direction) remain to some extent. Even when the seams S extending in the Z direction (the stacking direction) remain, the relatively large crystal grains G21_1 and G21_2 can prevent entering of the etching solution. That is, in the conductive film 21, the seams S extending in the Z direction may exist to some extent, but the seams S extending in the Y direction or the X direction are preferably reduced.

Figure 5:
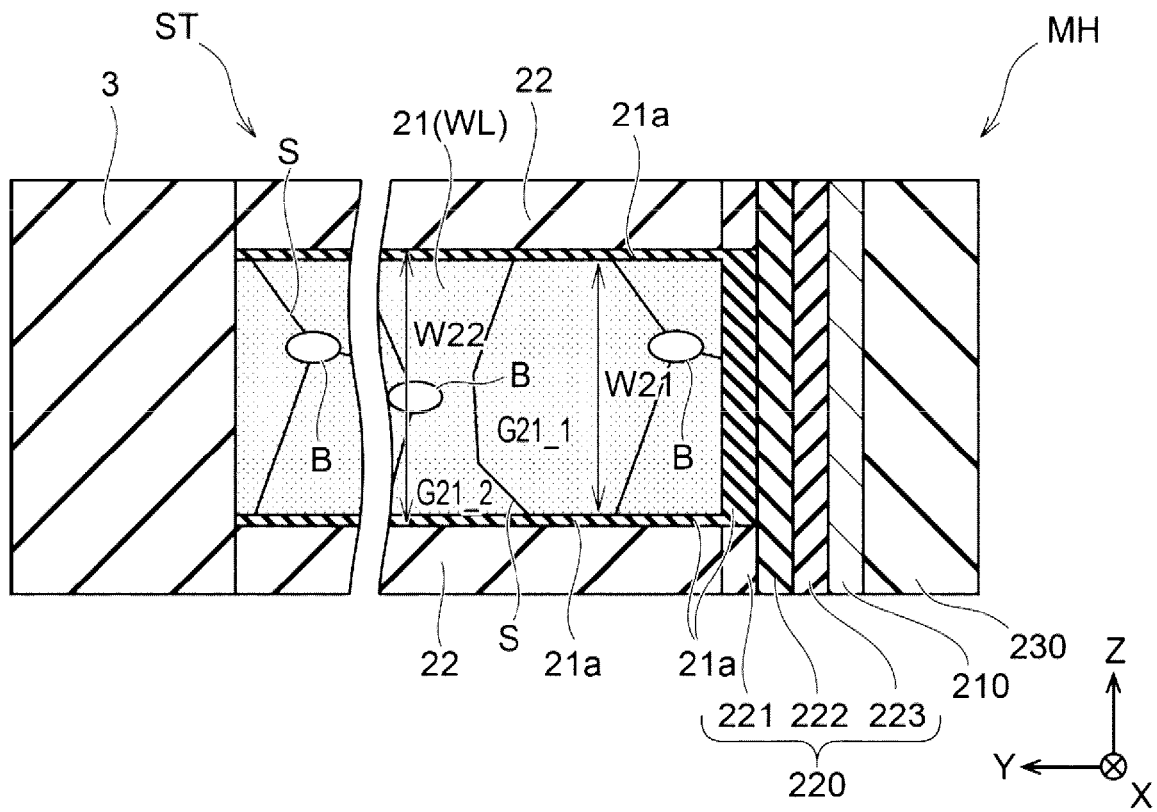
FIG. 5 is a cross-sectional view showing a configuration example in which voids are present in the conductive film.

FIG. 5 is a cross-sectional view showing a configuration example in which voids B are present in the conductive film 21. In the conductive film 21, the seams extending in the Y direction from the slit ST to the memory hole MH are reduced, but the seams S extending in the Z direction remain to some extent. Therefore, when the material of the conductive film 21 in the slit ST is etched, the etching solution may enter the seams S and generate the voids B in the seams S. Even in such a case, the crystal grains G21_1 and G21_2 of relatively large agglomerates can prevent the entering of the etching solution. That is, the voids may exist in the conductive film 21 to some extent.

Next, a manufacturing method of the semiconductor device 100a will be described.

FIGS. 6 to 18 are cross-sectional views showing an example of the manufacturing method of the semiconductor device 100a according to at least one embodiment. A configuration of a semiconductor memory shown in FIGS. 6 to 18 is an example, and the configuration of the semiconductor memory is not limited thereto.

Figure 6:
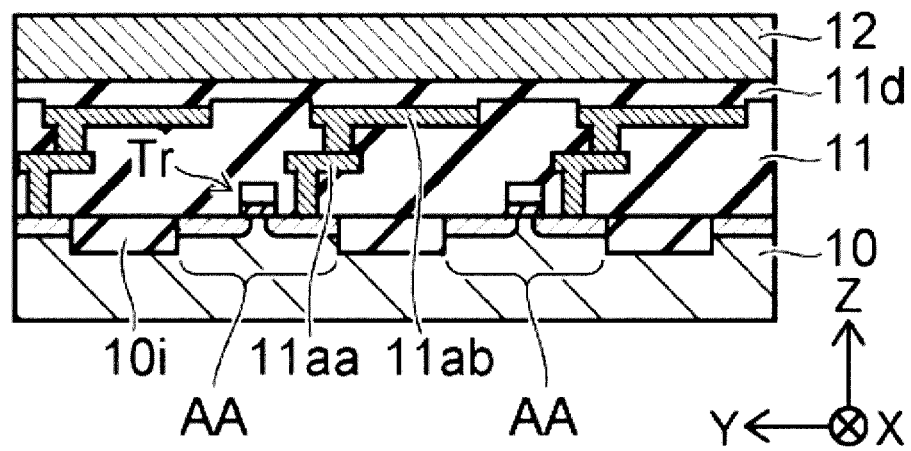
FIG. 6 is a cross-sectional view showing an example of a manufacturing method of the semiconductor device according to the embodiment.

First, as shown in FIG. 6, the element isolation areas 10i are formed in the substrate 10, and the transistor Tr is formed in the active area AA. Next, the insulating film 11 is formed on the substrate 10. The insulating film 11 is, for example, an interlayer insulating film and includes the wiring 11a. The wiring 11a is, for example, a multilayer wiring, and includes a wiring 11aa and a wiring 11ab provided above the wiring 11aa, for example. Next, an insulating film 11d is formed on the wiring 11ab. Next, the conductive film 12 is formed on the insulating film 11d.

Figure 7:
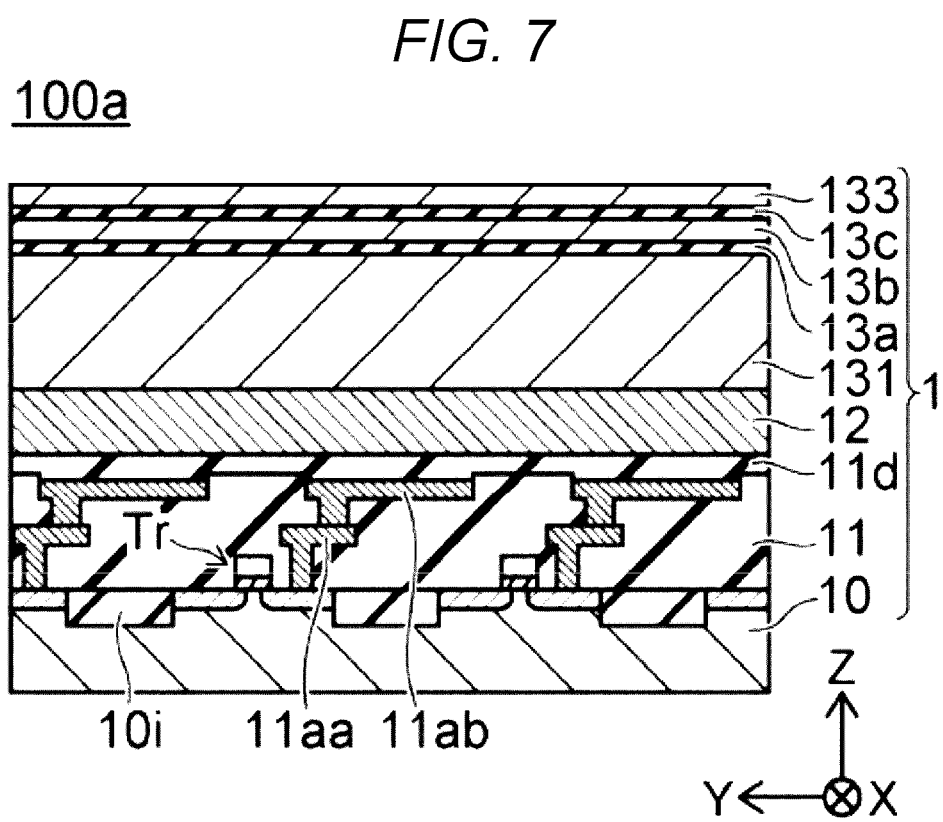
FIG. 7 is a cross-sectional view showing the manufacturing method of the semiconductor device following FIG. 6.

Next, as shown in FIG. 7, a semiconductor layer 131 is formed on the conductive film 12. For the semiconductor layer 131, for example, doped silicon or undoped silicon is used. Next, an intermediate film 13a is formed on the semiconductor layer 131. For the intermediate film 13a, for example, the silicon oxide film is used. Next, a sacrificial film 13b is formed on the intermediate film 13a. For the sacrificial film 13b, for example, the doped silicon or the undoped silicon is used. Next, an intermediate film 13c is formed on the sacrificial film 13b. For the intermediate film 13c, for example, the silicon oxide film is used. Next, a semiconductor layer 133 is formed on the intermediate film 13c. For the semiconductor layer 133, for example, the doped silicon or the undoped silicon is used. Accordingly, the structure of the base unit 1 is obtained.

Figure 8:
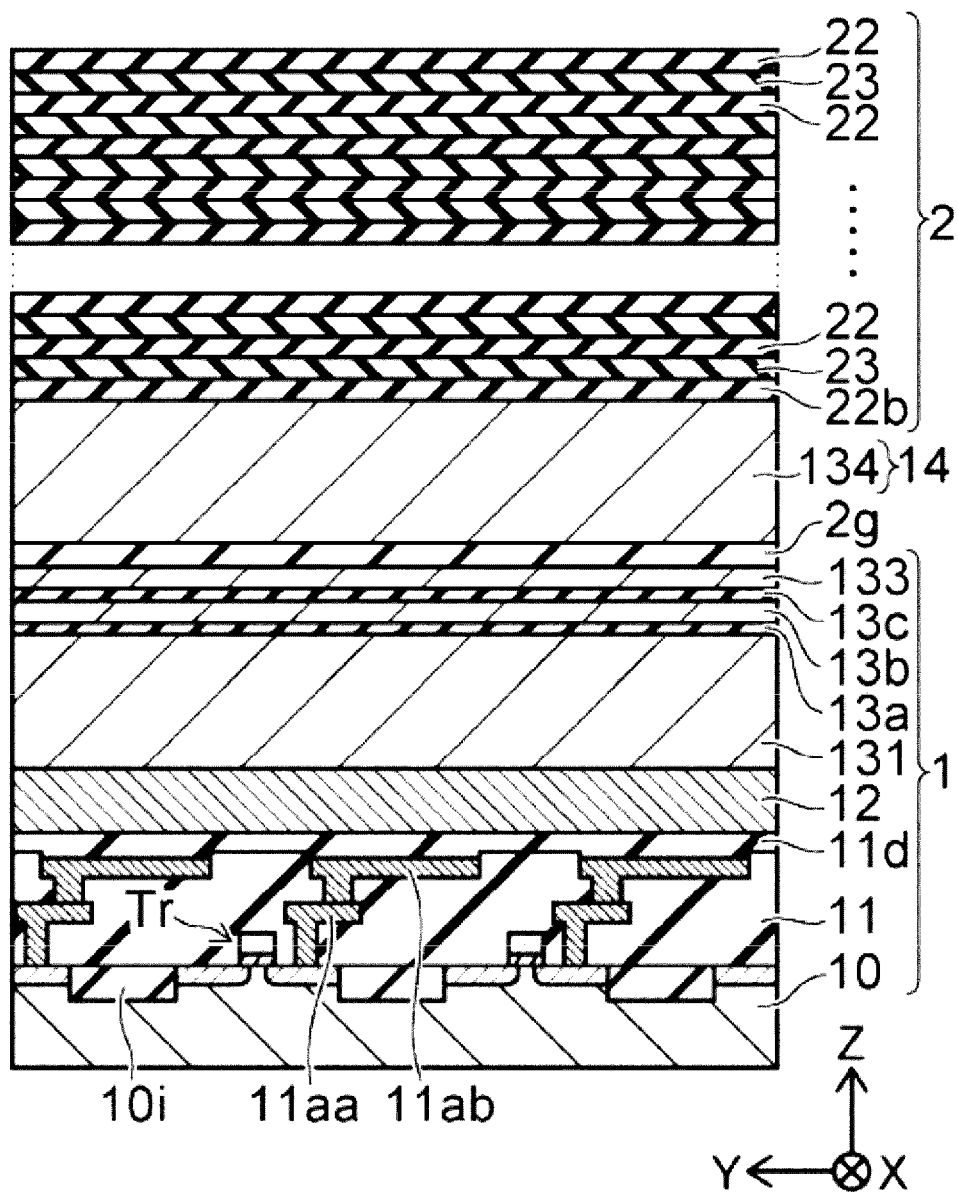
FIG. 8 is a cross-sectional view showing the manufacturing method of the semiconductor device following FIG. 7.

Next, as shown in FIG. 8, the insulating film 2g is formed on the semiconductor layer 133. For the insulating film 2g, for example, the silicon oxide or a metal oxide is used. Next, a semiconductor layer 134 is formed on the insulating film 2g. For the semiconductor layer 134, for example, the doped silicon is used. Accordingly, the semiconductor unit 14 is formed. Next, an insulating film 22b is formed on the semiconductor layer 134. Subsequently, sacrificial films 23 and the insulating films 22 are alternately stacked on the insulating film 22b. For the insulating films 22 and 22b, for example, the silicon oxide film is used. For the sacrificial films 23, for example, a silicon nitride film is used. Accordingly, a structure of the stacked body 2 is obtained above the semiconductor unit 13.

Figure 9:
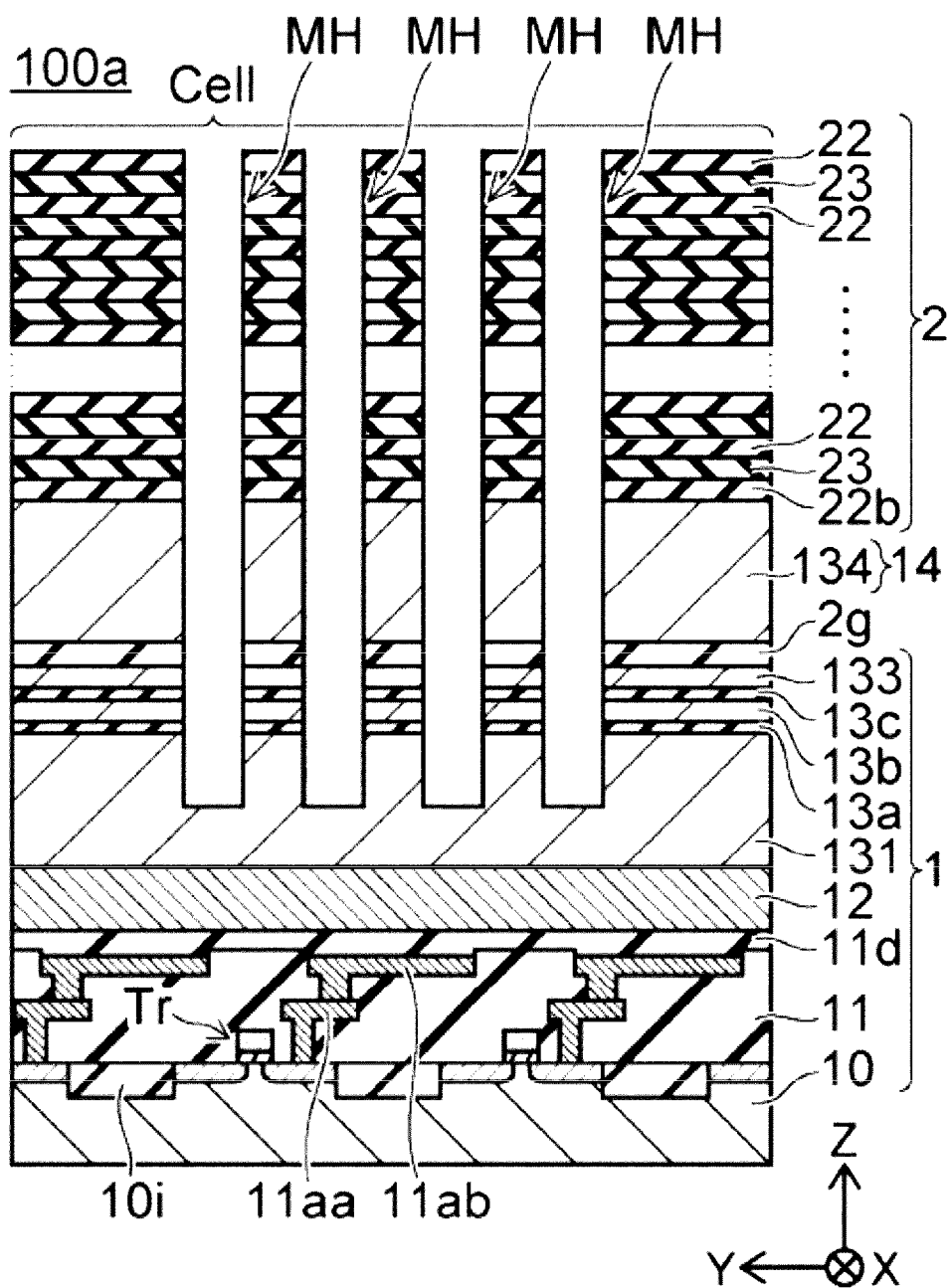
FIG. 9 is a cross-sectional view showing the manufacturing method of the semiconductor device following FIG. 8.

Next, as shown in FIG. 9, in a cell area, the stacked body 2, the semiconductor layer 134, the insulating film 2g, the semiconductor layer 133, the intermediate film 13c, the sacrificial film 13b, the intermediate film 13a, and the semiconductor layer 131 are anisotropically etched, and the memory holes MHs are formed. The memory holes MHs are formed so as to extend in the stacking direction of the stacked body 2, and are provided from the upper end of the stacked body 2 to the middle of the semiconductor layer 131.

Figure 10:
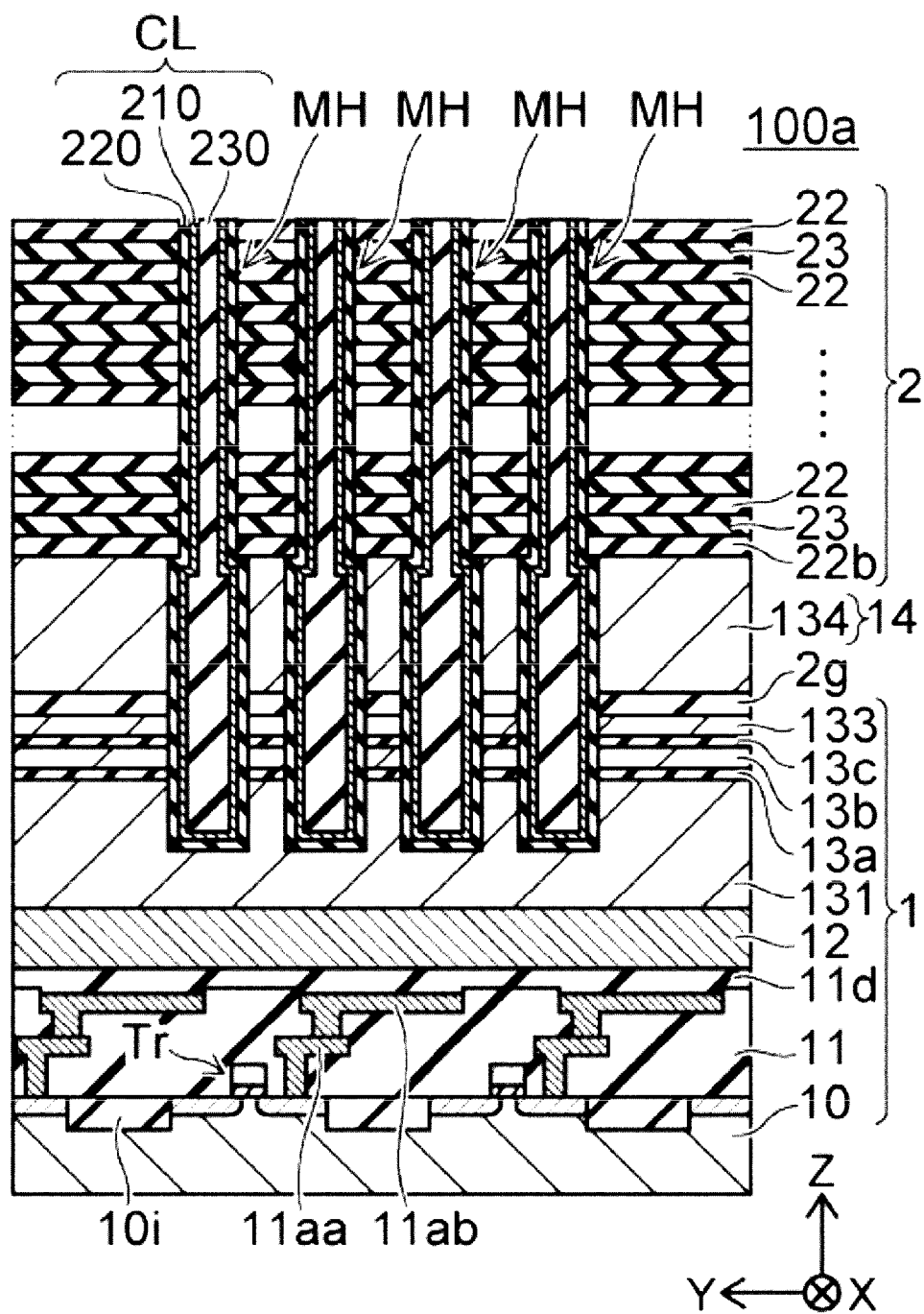
FIG. 10 is a cross-sectional view showing the manufacturing method of the semiconductor device following FIG. 9.

Next, as shown in FIG. 10, the memory film 220 is formed in the memory hole MH. At this time, the cover insulating film 221, the charge trapping film 222, and the tunnel insulating film 223 described in FIGS. 2 and 3 are formed in this order in the memory hole MH. Next, the semiconductor body 210 is formed on the memory film 220. Next, the core layer 230 is formed on the semiconductor body 210. In this way, the memory film 220 (the cover insulating film 221, the charge trapping film 222, the tunnel insulating film 223), the semiconductor body 210, and the core layer 230 are formed in this order on the inner wall of the memory hole MH. Accordingly, the memory hole MH is embedded with the memory film 220, the semiconductor body 210, and the core layer 230.

Figure 11:
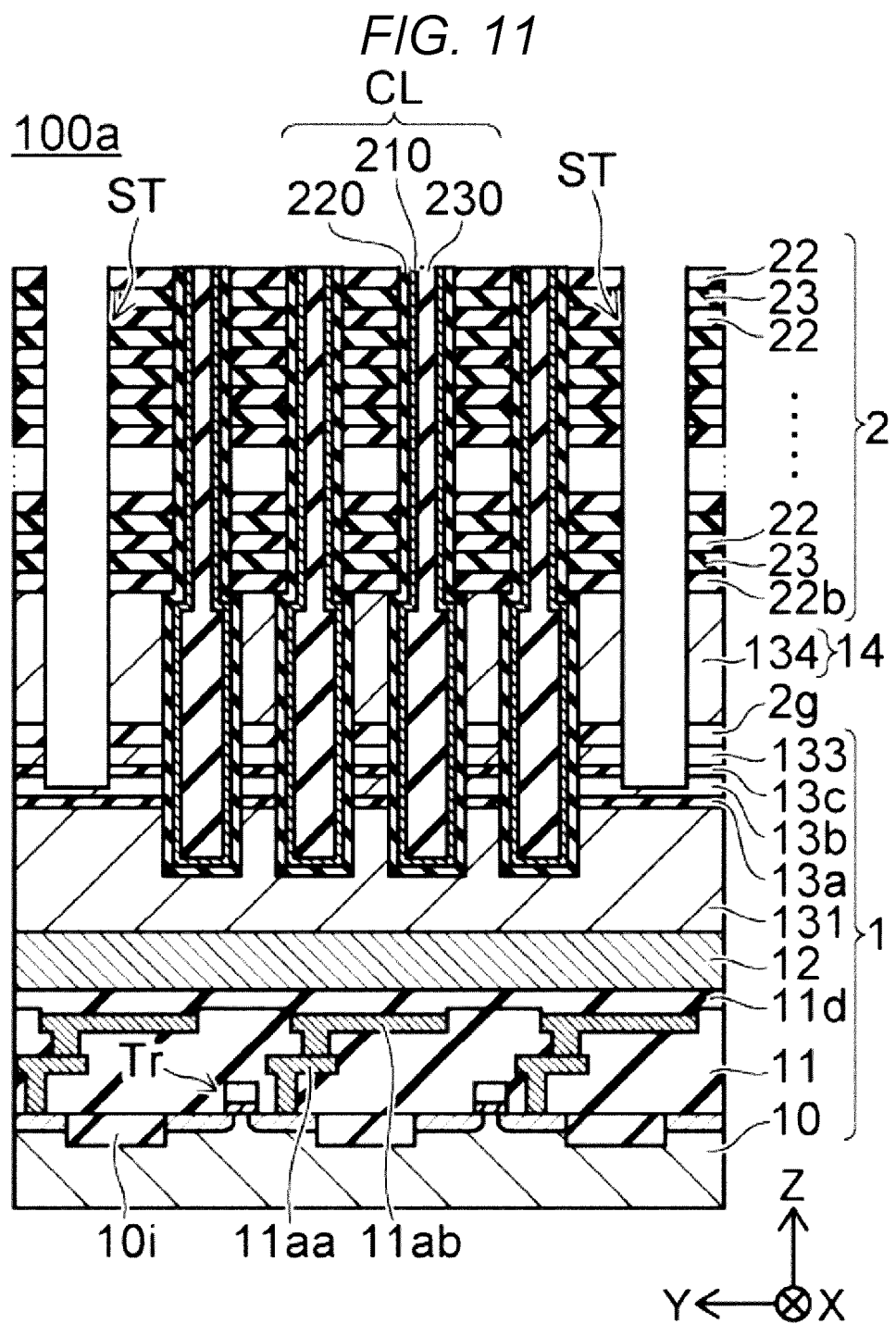
FIG. 11 is a cross-sectional view showing the manufacturing method of the semiconductor device following FIG. 10.

Next, as shown in FIG. 11, separately from the memory holes MHs, the stacked body 2 is anisotropically etched, and the slits STs are formed. The slits STs extend in the stacked body 2 in the Z direction and are formed from the upper end of the stacked body 2 to the middle of the sacrificial film 13b through the stacked body 2. Different from the memory holes MHs, the slits STs are formed as grooves extending also in the X direction. The slits STs may be formed with any depth as long as the slits STs penetrate the stacked body 2.

Figure 12:
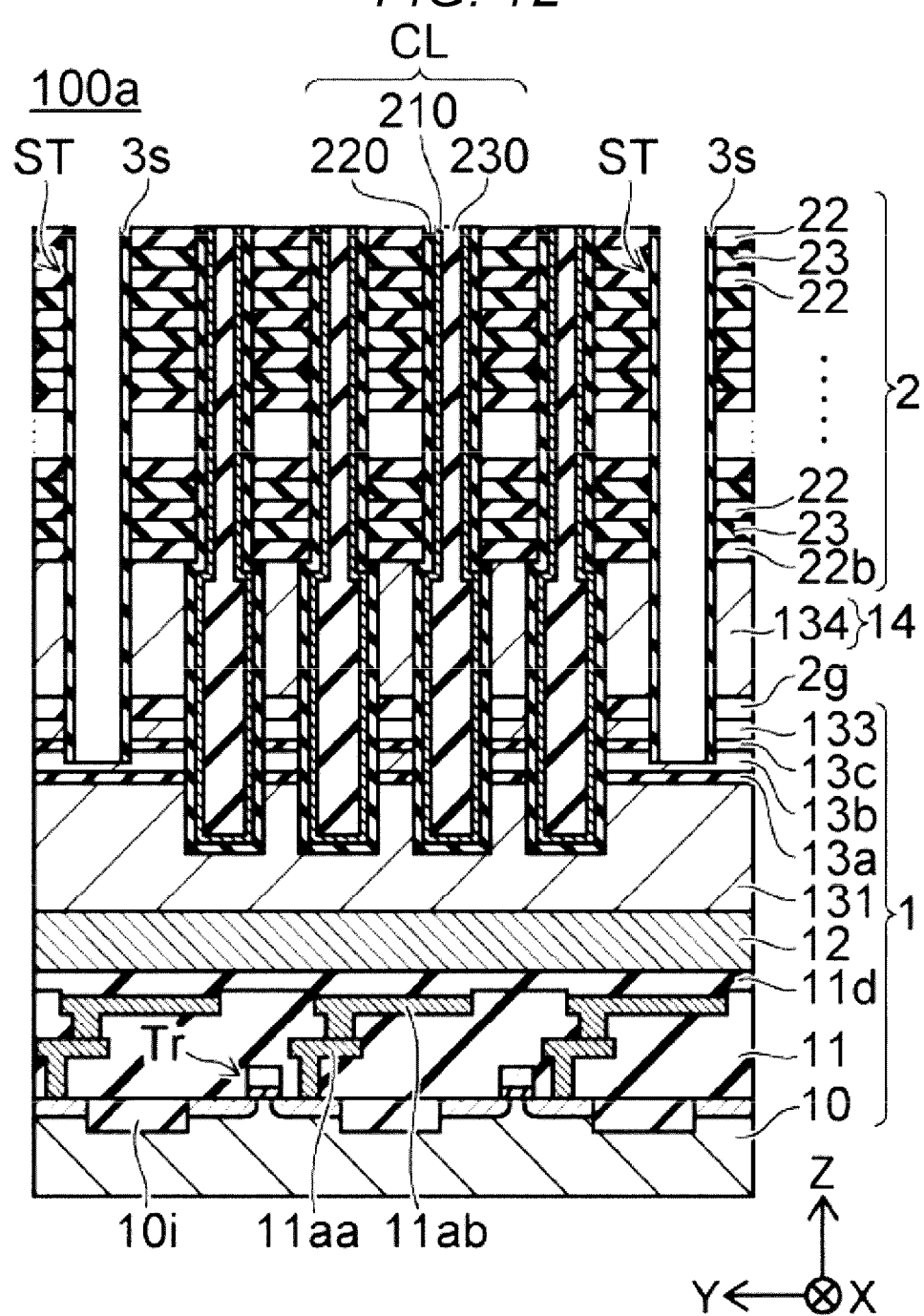
FIG. 12 is a cross-sectional view showing the manufacturing method of the semiconductor device following FIG. 11.

Next, as shown in FIG. 12, stopper films 3s are formed on sidewalls of the slits STs. For the stopper films 3s, for example, the silicon nitride is used.

Figure 13:
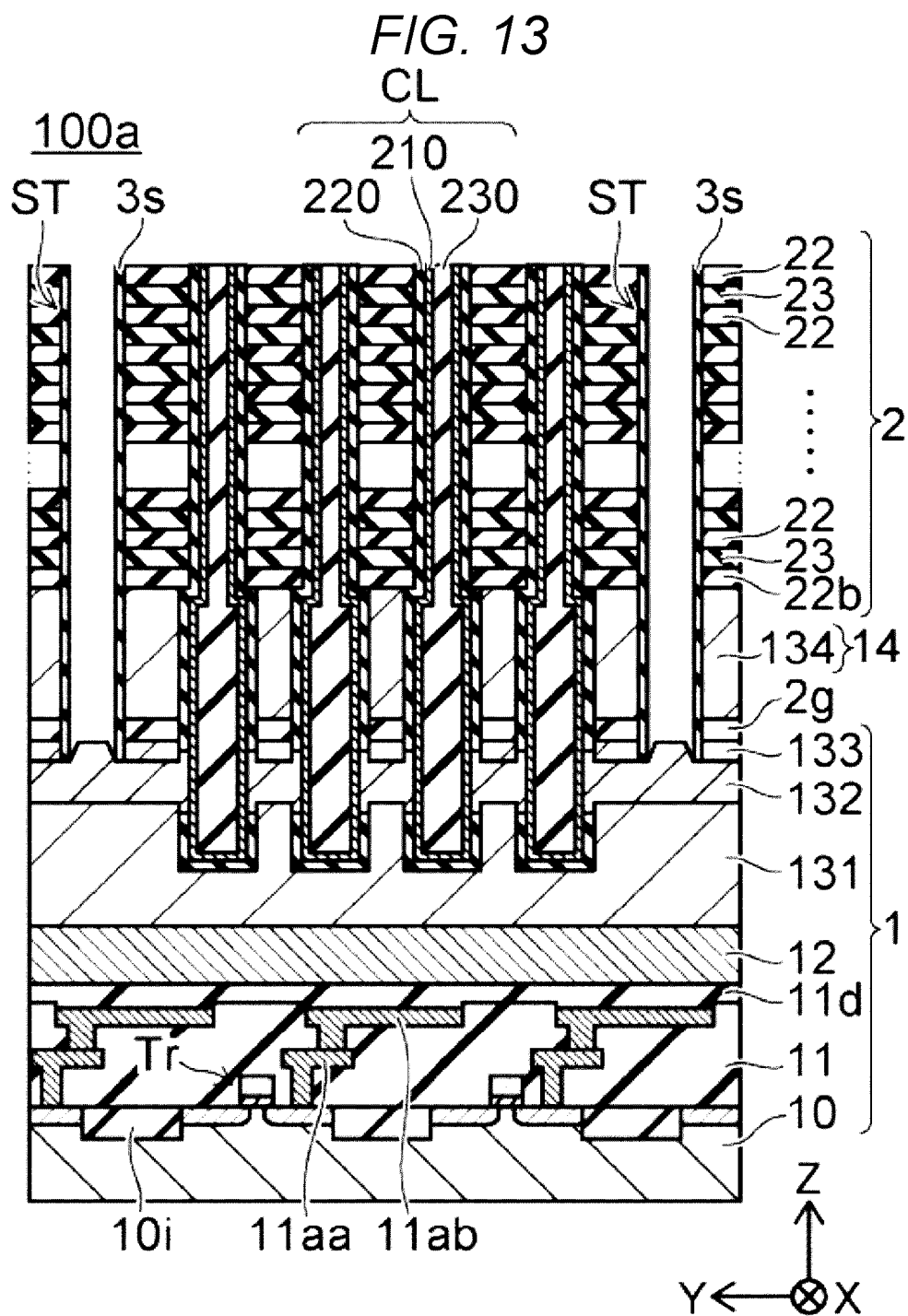
FIG. 13 is a cross-sectional view showing the manufacturing method of the semiconductor device following FIG. 12.

Next, as shown in FIG. 13, the intermediate film 13c, the sacrificial film 13b, and the intermediate film 13a are removed via the slits STs, and a semiconductor layer 132 is embedded. For the semiconductor layer 132, for example, the doped silicon is used. At this time, since the stopper films 3s cover the inner walls of the slits STs, the insulating films 22 are not etched.

Figure 14:
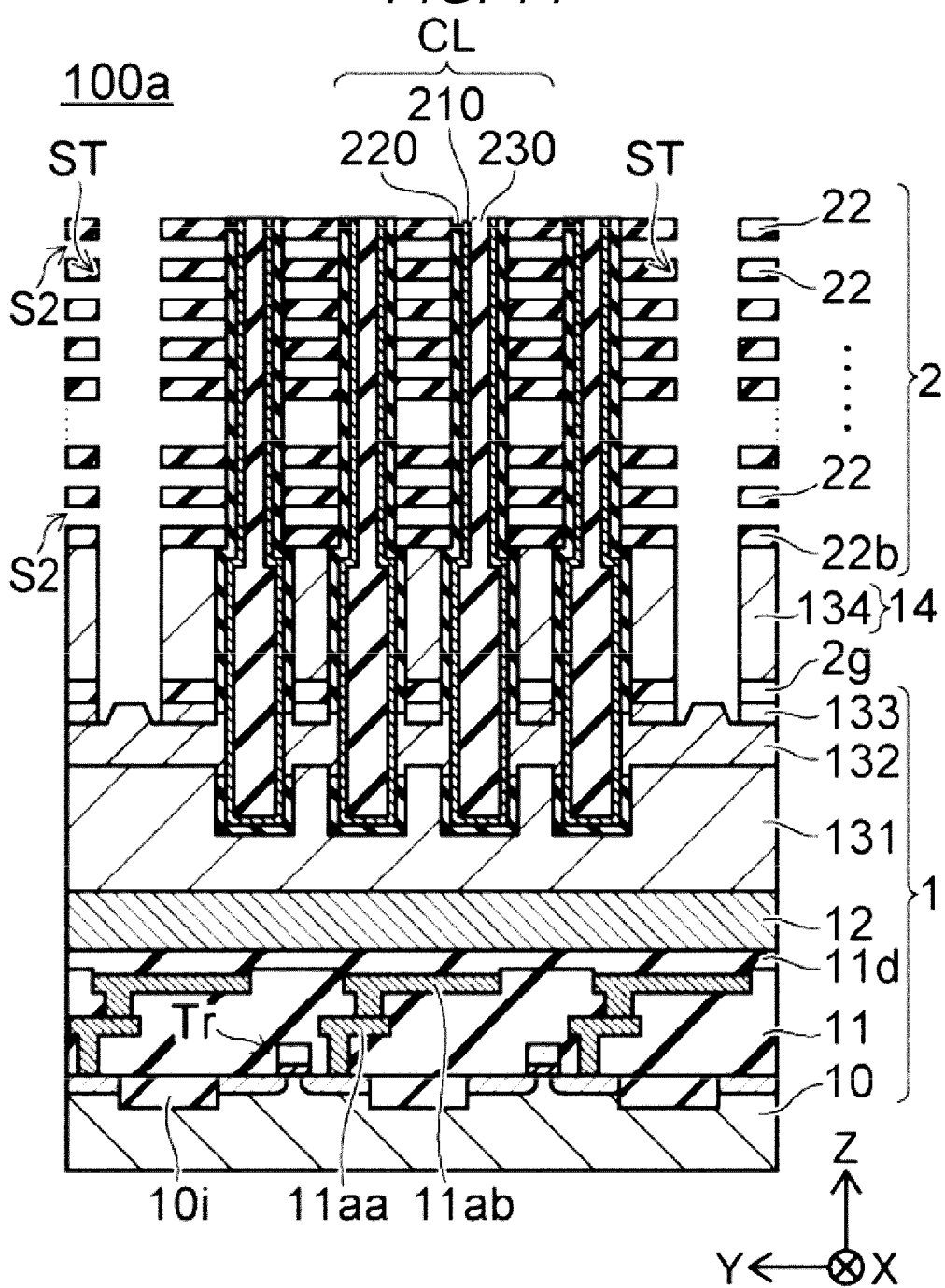
FIG. 14 is a cross-sectional view showing the manufacturing method of the semiconductor device following FIG. 13.

Next, as shown in FIG. 14, the sacrificial films 23 are isotropically etched together with the stopper films 3s via the slits STs using a hot phosphoric acid solution. The hot phosphoric acid solution selectively etches the silicon nitride film with respect to the silicon oxide film and the silicon. Therefore, as shown in FIG. 14, the sacrificial films 23 are selectively removed while the insulating films 22 are remained, and spaces S2 are formed in the Y direction and the X direction. At this time, the etching of the sacrificial films 23 proceeds toward the memory holes MHs in the Y direction. However, since the cover insulating films 221 are formed of the silicon oxide film, the etching of the sacrificial films 23 stops at the cover insulating films 221. Therefore, the spaces S2 are provided between the plurality of insulating films 22 adjacent in the Z direction from the slits STs to the cover insulating films 221 of the memory holes MHs.

Figure 16A:
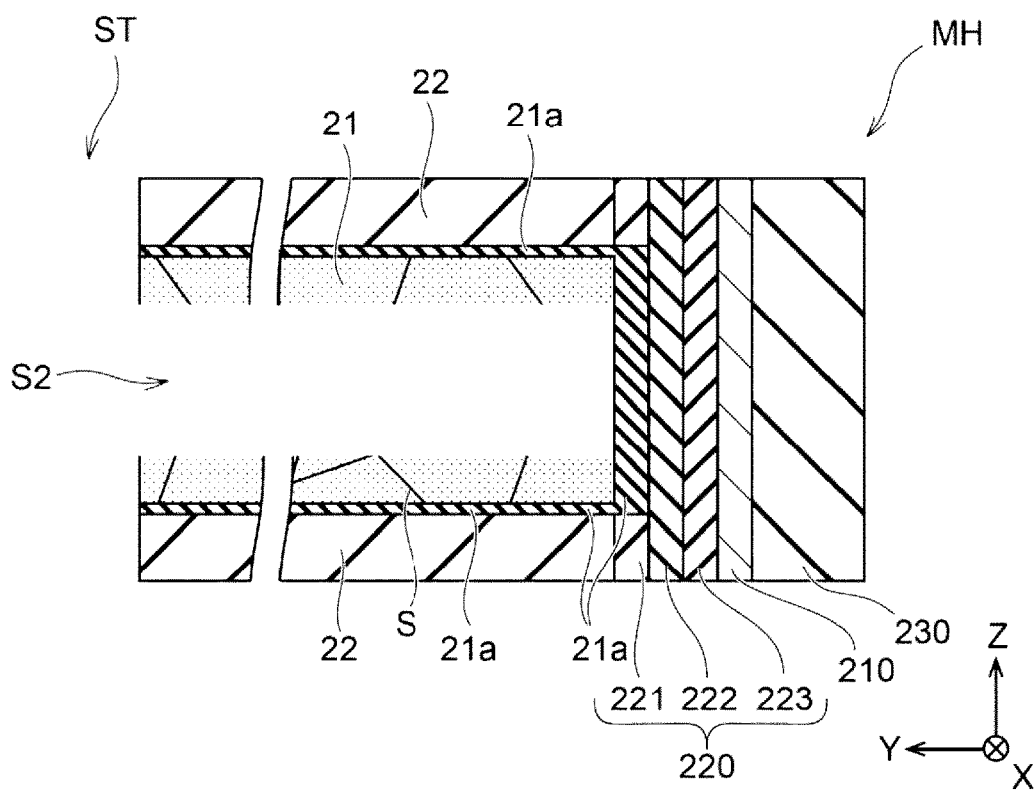
FIG. 16A and FIG. 16B are cross-sectional views showing an example of a deposition process of the conductive film.

Next, although not shown in FIG. 14, the aluminum oxide ($Al_2O_3$) is thinly formed as the block insulating film 21a on inner walls of the spaces S2 via the slits STs using a thermal chemical vapor deposition (CVD) method or an atomic layer deposition (ALD) method (see FIG. 16A). The aluminum oxide has, for example, a thickness of about 2 to 3 nm. The block insulating film 21a functions as the seed layer for forming the molybdenum described later.

Figure 15:
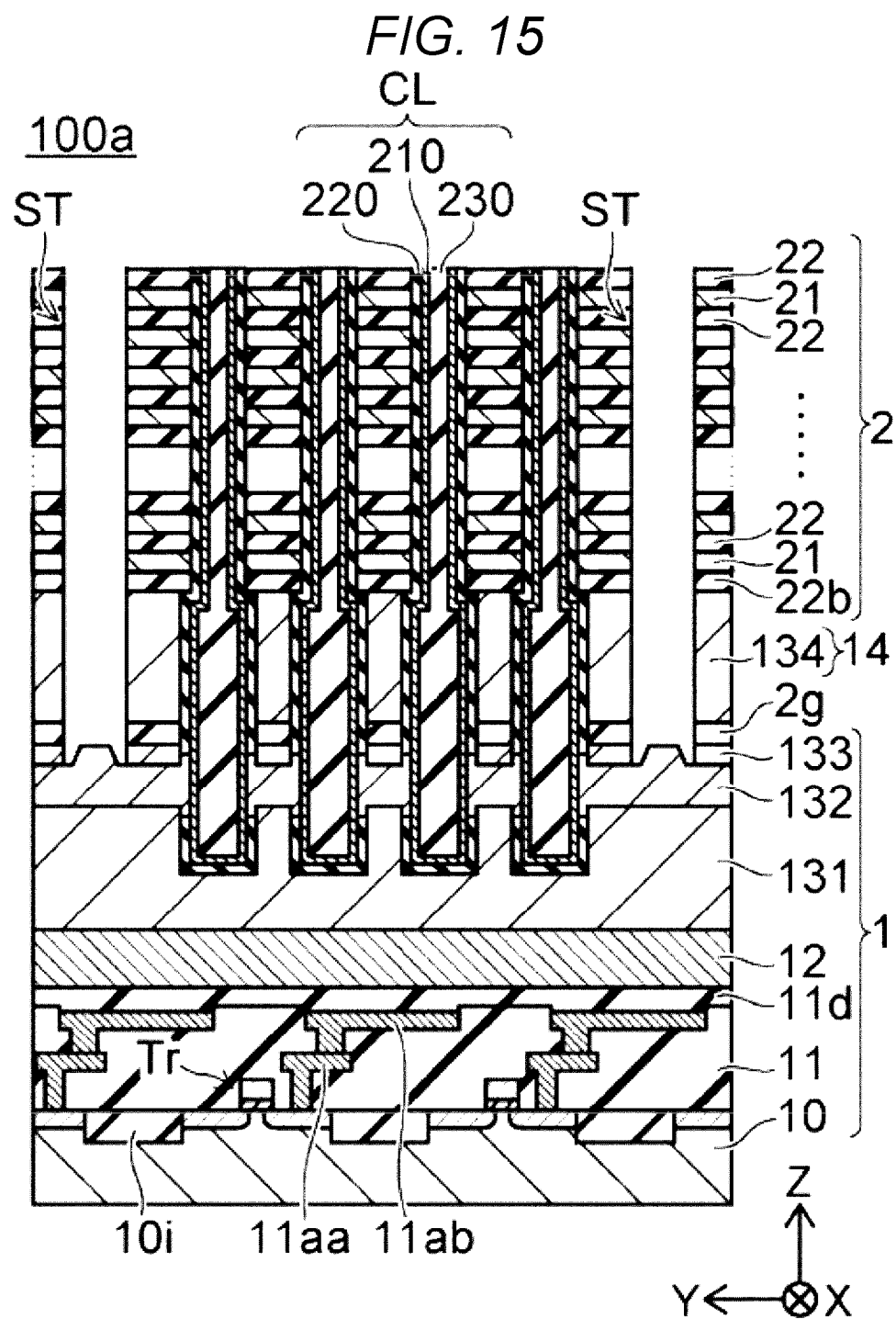
FIG. 15 is a cross-sectional view showing the manufacturing method of the semiconductor device following FIG. 14.

Next, as shown in FIG. 15, the molybdenum is embedded in the spaces S2 via the slits STs by using the thermal CVD method or the ALD method, and the conductive films 21 are formed. At this time, the conductive films 21 are formed using a reducing gas such as hydrogen or ammonia as a source gas containing the molybdenum in an atmosphere of 500° C. to 600° C. Accordingly, the molybdenum is filled in the spaces S2 as the material of the conductive films 21. Thus, the conductive films 21 are formed by embedding the molybdenum in the spaces S2 via the slits STs.

Figure 16B:
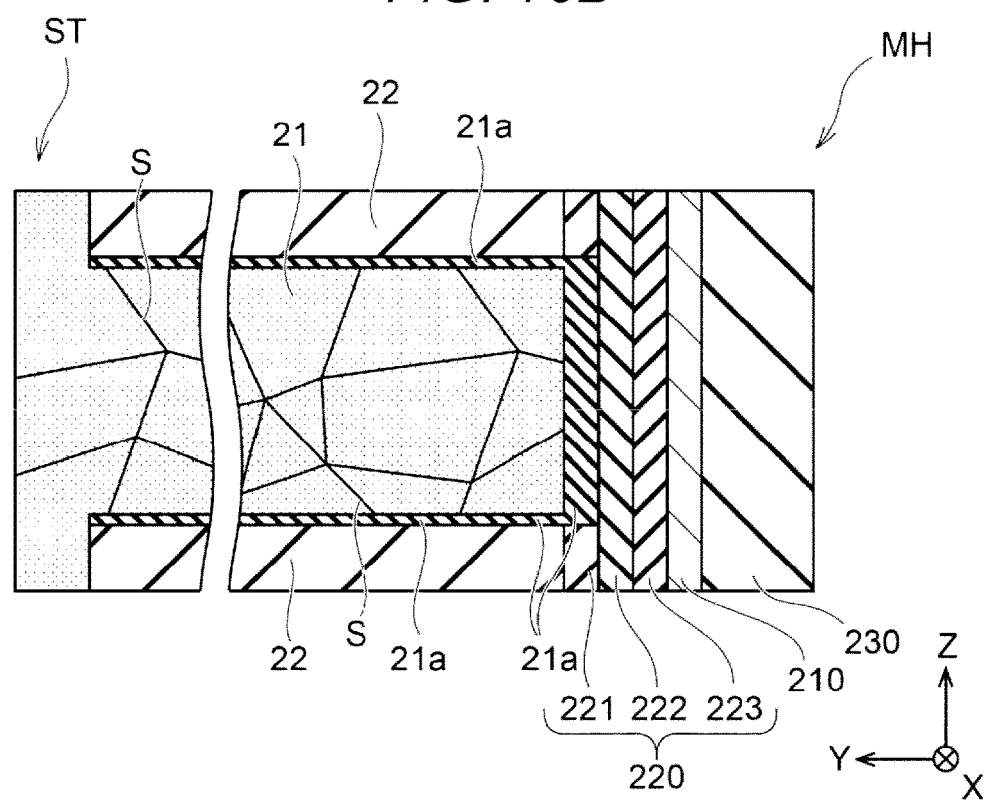

FIGS. 16A and 16B are cross-sectional views showing an example of a deposition process of the conductive film 21. When the molybdenum is deposited, as shown in FIG. 16A, the conductive film 21 (the molybdenum) is formed in the space S2. When the deposition of the molybdenum proceeds, as shown in FIG. 16B, the conductive film 21 (the molybdenum) is filled in the space S2. At this time, a particle diameter of the molybdenum is relatively small. Therefore, the seams (grain boundaries) S between the agglomerates of the molybdenum extend in any of the X, Y, and Z directions. In addition, the molybdenum is also deposited on the inner walls of the slit ST (side walls of the insulating films 22).

At this stage, the seams S extend in the Y direction from the slit ST to the memory hole MH. Therefore, when the molybdenum formed on the inner walls of the slit ST is to be removed by etching immediately after the deposition of the molybdenum, the etching solution enters the seams S, and most of the molybdenum in the space S2 is etched. For example, the etching solution enters along the seams S extending in the Y direction and even the molybdenum near the memory hole MH is etched.

Figure 17A:
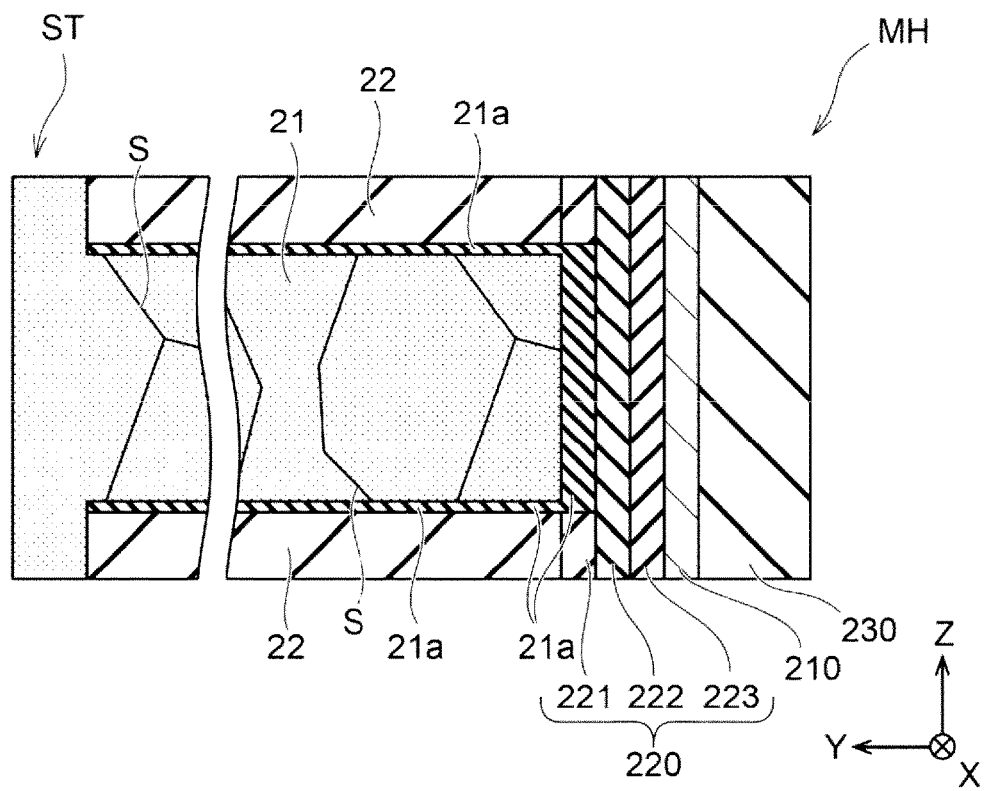
FIG. 17A and FIG. 17B are cross-sectional views showing an example of a heat treatment process and an etching back process of the conductive film.

In contrast, according to at least one embodiment, after the deposition of the molybdenum, a heat treatment is carried out in a hydrogen gas atmosphere at a temperature higher than a film formation temperature of the conductive films 21. For example, the heat treatment is carried out in an atmosphere at a temperature of 600° C. to 800° C. Accordingly, as shown in FIG. 17A, the particle diameter of the conductive film 21 (the molybdenum) is increased, and the seams are reduced or shortened. FIG. 17A is a cross-sectional view of an example of a heat treatment process of the conductive films 21. For example, by performing the heat treatment at the temperature of 600° C. to 800° C., the particle diameter of the molybdenum is increased and becomes the large agglomerates extending in the insulating films 22 adjacent in the Z direction. That is, the molybdenum includes the large crystal grains that reach from the upper surface to the lower surface of the conductive films 21. Accordingly, the seams S extending in the Y direction are reduced or shortened.

Further, in the embodiment, the seed layer (abase layer) of the molybdenum is formed by using the aluminum oxide (the block insulating film 21a). Since the aluminum oxide and the molybdenum are significantly different in crystal structures, the agglomerates of the molybdenum formed using the aluminum oxide as the seed layer are not easily affected by a crystallinity of the aluminum oxide. Therefore, by using the aluminum oxide as the seed layer of the molybdenum, the particle diameter of the molybdenum is easily increased.

Figure 17B:
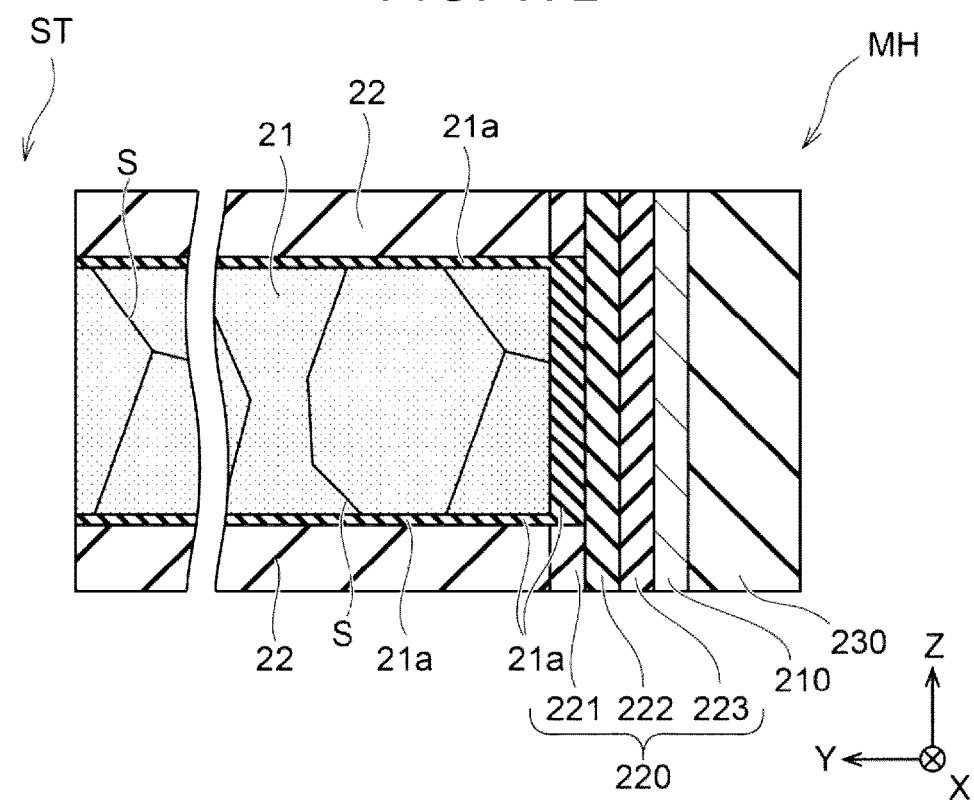

Next, the molybdenum deposited on the sidewalls of the insulating films 22 in the slits STs is removed while the molybdenum filled in the spaces S2 between the insulating films 22 is remained. At this time, the molybdenum is etched via the slits STs by wet etching using, for example, a mixed solution containing phosphoric acid as the etching solution. Accordingly, as shown in FIG. 17B, the molybdenum on the sidewalls of the insulating films 22 in the slits STs is removed (etched back). FIG. 17B is a cross-sectional view showing an example of an etch-back process of the material of the conductive films 21. Accordingly, the molybdenum embedded in a plurality of spaces S2 arranged in the Z direction is electrically cut off with each other, and each can function as the conductive film 21 (the word line WL) as shown in FIG. 15.

Here, the agglomerates of the molybdenum as the material of the conductive films 21 are enlarged by the heat treatment, and the seams S are reduced and shortened. Accordingly, the molybdenum has a particle diameter substantially the same as the width between the insulating films 22 adjacent in the Z direction (W22 in FIG. 4) or a width of the space S2 in the X direction (W21 in FIG. 4). Therefore, even when the etching solution of the molybdenum enters along the seams S, an etching amount of the molybdenum in the spaces S2 is limited, and the etching solution does not enter the memory hole MH side so much. Accordingly, the over-etching of the conductive films 21 provided between the insulating films 22 adjacent to each other can be prevented.

Figure 18:
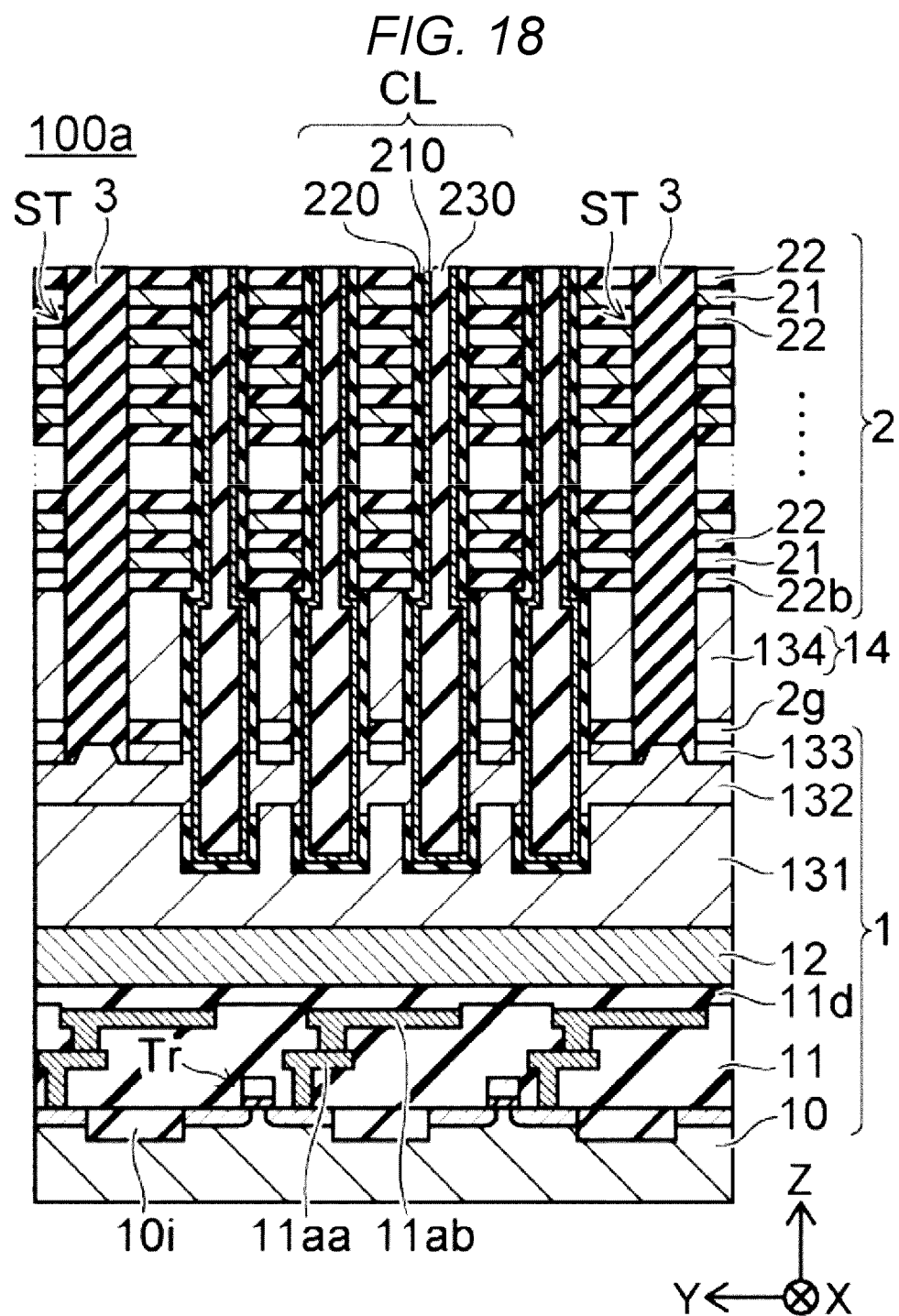
FIG. 18 is a cross-sectional view showing the manufacturing method of the semiconductor device following FIG. 15.

Next, as shown in FIG. 18, the insulating material 3 is filled in the slits STs.

Thereafter, the contacts Cbs, the bit lines BLs, the wiring, or the like are formed, and the semiconductor device 100a shown in FIG. 1 is obtained.

According to at least one embodiment, the molybdenum is used for the conductive films 21 functioning as the word lines WLs. The molybdenum is embedded in the spaces S2 instead of the sacrificial films 23, and then subjected to heat treatment at 600° C. to 800° C. Accordingly, the particle diameter of the molybdenum is increased, and the molybdenum is formed (grown) into the agglomerates that are large enough to extend between the insulating films 22 adjacent in the Z direction. In addition, the seams of the molybdenum are reduced and shortened. Accordingly, it is possible to prevent the etching solution used for the etch-back of the molybdenum from entering the memory hole MH side, and prevent the over-etching of the conductive films 21. As a result, it is possible to prevent an increase in a resistance value of the conductive films 21 and electrical cutting off in the X direction or Y direction.

In at least one embodiment, the seams in the conductive films 21 are not completely eliminated, and remain to some extent. Accordingly, due to the etch-back of the molybdenum (the conductive films 21), the voids B may be generated in the conductive films 21 to some extent as shown in FIG. 5. However, even in this case, there is no problem as long as the resistance value of the conductive films 21 is sufficiently reduced. That is, even when the seams S or the voids B remain in the conductive films 21 to some extent, an effect of the at least one embodiment is not lost.

In addition, the at least one embodiment is applicable to the semiconductor device other than the semiconductor memory. In this case, for example, the embodiment is applied when the conductive films (the molybdenum) is filled between the plurality of insulating films adjacent in any of the X, Y, and Z directions. This conductive film (the molybdenum) may be used as the wiring, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a plurality of insulating films adjacent to each other;
   a conductive film provided between the plurality of insulating films, the conductive film including molybdenum having a grain which extends from a first end to a second end of the conductive film in a first direction, the first direction being from one of the plurality of insulating films to another of the plurality of insulating films; and
   a block insulating film provided between the plurality of insulating films and the conductive film, and formed of a metal oxide.

2. The semiconductor device according to claim 1, wherein the insulating films are formed of silicon oxide or a dielectric having a dielectric constant greater than that of silicon oxide.

3. The semiconductor device according to claim 1, wherein the semiconductor device is a memory cell array.

4. The semiconductor device according to claim 1, wherein the metal oxide includes aluminum oxide.

5. The semiconductor device according to claim 1, wherein the metal oxide is thinner than the conductive film.

6. The semiconductor device according to claim 1, wherein the conductive film has a seam or a void.

7. The semiconductor device according to claim 1, further comprising:
- a semiconductor pillar provided inside a stacked body including the insulating films and the conductive film that are alternately stacked, and extending in a stacking direction of the stacked body;
- a tunnel insulating film provided between the conductive film and the semiconductor pillar; and
- a charge trapping film provided between the tunnel insulating film and the conductive film.

8. The semiconductor device according to claim 7, wherein the tunnel insulating film is formed from at least one of silicon oxide, silicon nitride, or silicon oxynitride.

9. A semiconductor device comprising:
- a plurality of insulating films adjacent to each other; and
- a conductive film provided between the plurality of insulating films, the conductive film is formed of molybdenum having a grain diameter same as a width between adjacent insulating films among the plurality of insulating films.

10. The semiconductor device according to claim 9, further comprising:
- a semiconductor pillar provided inside a stacked body including the insulating films and the conductive film that are alternately stacked, and extending in a stacking direction of the stacked body;
- a tunnel insulating film provided between the conductive film and the semiconductor pillar;
- a charge trapping film provided between the tunnel insulating film and the conductive film; and
- a block insulating film provided between the charge trapping film and the conductive film.

11. The semiconductor device according to claim 9, further comprising:
- a block insulating film provided between the plurality of insulating films and the conductive film, and formed of a metal oxide.

12. The semiconductor device according to claim 11, wherein the metal oxide includes aluminum oxide.

13. The semiconductor device according to claim 11, wherein the metal oxide is thinner than the conductive film.

14. The semiconductor device according to claim 11, wherein the conductive film has a seam or a void.

* * * * *